United States Patent
Goldfarb et al.

(10) Patent No.: US 8,373,271 B2
(45) Date of Patent: Feb. 12, 2013

(54) INTERCONNECT STRUCTURE WITH AN OXYGEN-DOPED SIC ANTIREFLECTIVE COATING AND METHOD OF FABRICATION

(75) Inventors: Dario L. Goldfarb, Dobbs Ferry, NY (US); Ranee W. Kwong, Wappingers Falls, NY (US); Qinghuang Lin, Yorktown Heights, NY (US); Deborah A. Neumayer, Danbury, CT (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 12/788,912

(22) Filed: May 27, 2010

(65) Prior Publication Data

US 2011/0291284 A1     Dec. 1, 2011

(51) Int. Cl.
*H01L 23/532* (2006.01)

(52) U.S. Cl. ............... 257/750; 257/774; 257/E23.145; 257/E21.557; 438/597

(58) Field of Classification Search ............. 438/638, 438/597; 257/750, 773, 774, E23.142, E23.145, 257/E21.577, E21.59
See application file for complete search history.

(56) References Cited

U.S. PATENT DOCUMENTS

| | | |
|---|---|---|
| 4,371,605 A | 2/1983 | Renner |
| 5,886,102 A | 3/1999 | Sinta et al. |
| 5,939,236 A | 8/1999 | Pavelchek et al. |
| 6,025,260 A | 2/2000 | Lien et al. |
| 6,087,064 A | 7/2000 | Lin et al. |
| 6,214,719 B1 | 4/2001 | Nag |
| 6,455,416 B1 | 9/2002 | Subramanian et al. |

(Continued)

FOREIGN PATENT DOCUMENTS

| | | |
|---|---|---|
| CA | 1204547 | 5/1986 |
| JP | 01293339 | 11/1989 |

(Continued)

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

(Continued)

*Primary Examiner* — Allan R Wilson
(74) *Attorney, Agent, or Firm* — Scully, Scott, Murphy & Presser, P.C.; Daniel P. Morris, Esq.

(57) ABSTRACT

An interconnect structure is provided that includes at least one patterned and cured photo-patternable low k material located on a surface of a patterned and cured oxygen-doped SiC antireflective coating (ARC). A conductively filled region is located within the at least one patterned and cured photo-patternable low k material and the patterned and cured oxygen-doped SiC ARC. The oxygen-doped SiC ARC, which is a thin layer (i.e., less than 400 angstroms), does not produce standing waves that may degrade the diffusion barrier and the electrically conductive feature that are embedded within the patterned and cured photo-patternable low k dielectric material and, as such, structural integrity is maintained. Furthermore, since a thin oxygen-doped SiC ARC is employed, the plasma etch process time used to open the material stack of the ARC/dielectric cap can be reduced, thus reducing potential plasma damage to the patterned and cured photo-patternable low k material. Also, the oxygen-doped SiC ARC can withstand current BEOL processing conditions.

28 Claims, 6 Drawing Sheets

U.S. PATENT DOCUMENTS

| | | | |
|---|---|---|---|
| 6,492,256 B2 | 12/2002 | Lee et al. | |
| 6,492,732 B2 | 12/2002 | Lee et al. | |
| 6,514,667 B2 | 2/2003 | Angelopoulos et al. | |
| 6,566,019 B2 | 5/2003 | Kling et al. | |
| 6,780,753 B2 | 8/2004 | Latchford et al. | |
| 6,787,469 B2 | 9/2004 | Houston et al. | |
| 6,805,109 B2 | 10/2004 | Cowan | |
| 6,861,180 B2 | 3/2005 | Chang | |
| 6,861,367 B2 | 3/2005 | Gilton et al. | |
| 6,902,870 B1 * | 6/2005 | Aminpur et al. | 430/320 |
| 7,041,748 B2 | 5/2006 | Lin et al. | |
| 7,056,840 B2 | 6/2006 | Miller et al. | |
| 7,064,078 B2 | 6/2006 | Liu et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,226,876 B2 * | 6/2007 | Schmitt et al. | 438/787 |
| 7,253,095 B2 | 8/2007 | Lur et al. | |
| 7,306,853 B2 | 12/2007 | Lin et al. | |
| 2001/0016412 A1 | 8/2001 | Lee et al. | |
| 2002/0163082 A1 | 11/2002 | Lee et al. | |
| 2003/0073028 A1 | 4/2003 | Kim et al. | |
| 2003/0129531 A1 | 7/2003 | Oberlander et al. | |
| 2003/0198877 A1 | 10/2003 | Pfeiffer et al. | |
| 2004/0048194 A1 | 3/2004 | Breyta et al. | |
| 2004/0094821 A1 | 5/2004 | Lur et al. | |
| 2004/0151489 A1 | 8/2004 | Zhou | |
| 2005/0093158 A1 | 5/2005 | Liu et al. | |
| 2005/0263896 A1 | 12/2005 | Lur et al. | |
| 2006/0038297 A1 * | 2/2006 | Usami et al. | 257/758 |
| 2006/0228895 A1 | 10/2006 | Chae et al. | |
| 2007/0003841 A1 | 1/2007 | Choi | |
| 2007/0020565 A1 | 1/2007 | Koh et al. | |
| 2007/0054198 A1 | 3/2007 | Park | |
| 2007/0148968 A1 | 6/2007 | Kwon et al. | |
| 2007/0212649 A1 | 9/2007 | Lalbahadoersing et al. | |
| 2007/0248899 A1 | 10/2007 | Choi | |
| 2008/0173984 A1 | 7/2008 | Lin et al. | |
| 2008/0286467 A1 | 11/2008 | Allen et al. | |
| 2009/0079075 A1 | 3/2009 | Lin et al. | |
| 2009/0079076 A1 | 3/2009 | Lin et al. | |
| 2009/0081418 A1 * | 3/2009 | Allen et al. | 428/195.1 |
| 2009/0174067 A1 | 7/2009 | Lin | |
| 2009/0233226 A1 | 9/2009 | Allen et al. | |
| 2009/0291389 A1 | 11/2009 | Allen et al. | |
| 2010/0267228 A1 * | 10/2010 | Koike et al. | 438/643 |
| 2010/0283157 A1 * | 11/2010 | Lin et al. | 257/773 |
| 2011/0042790 A1 * | 2/2011 | Lin | 257/635 |
| 2012/0161296 A1 * | 6/2012 | Lin | 257/635 |

FOREIGN PATENT DOCUMENTS

| | | |
|---|---|---|
| WO | WO2009037117 A1 | 3/2009 |
| WO | WO2009037119 A1 | 3/2009 |

OTHER PUBLICATIONS

U.S. Appl. No. 12/721,032 entitled, "Methods for Fabrication of an Air Gap-Containing Interconnect Structure", filed Mar. 10, 2010, first named inventor: Lawrence A. Clevenger.

U.S. Appl. No. 12/569,200 entitled, "Patternable Low-K Dielectric Interconnect Structure With a Graded Cap Layer and Method of Fabrication", filed Sep. 29, 2009, first named inventor: Qinghuang Lin.

International Search Report dated Jul. 14, 2011 received in a corresponding foreign application.

* cited by examiner

INTERCONNECT STRUCTURE WITH AN OXYGEN-DOPED SIC ANTIREFLECTIVE COATING AND METHOD OF FABRICATION

FIELD OF THE INVENTION

The present invention relates to semiconductor structures and methods of fabricating the same. More particularly, the present invention relates to semiconductor interconnect structures (single-damascene and dual-damascene) including a patterned and cured photo-patternable low k (PPLK) material as a permanent on-chip insulator and an underlying patterned oxygen-doped silicon carbide (SiC) antireflective coating (ARC).

BACKGROUND

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to increase the aspect ratio (i.e., height to width ratio) and to reduce the dielectric constant, k, of interlayer dielectric (ILD) materials used to electrically insulate metal conductive lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low-k) dielectric, and have up to twelve levels of Cu/low-k interconnect layers. These Cu/low-k interconnect layers are fabricated with an iterative additive process, called dual-damascene, which includes several processing steps, which are described in greater detail in the following paragraphs.

When fabricating integrated circuit wiring within a multi-layered scheme, an insulating or dielectric material, e.g., silicon oxide or a low-k insulator will normally be patterned with several thousand openings to create conductive line openings and/or via openings using photo patterning and plasma etching techniques, e.g., photolithography with subsequent etching by plasma processes.

Unfortunately, the strategy to introduce low-k materials (typically dielectrics whose dielectric constant is below that of silicon oxide) into advanced interconnects is difficult to implement due to the new materials chemistry of the low-k materials that are being introduced. Moreover, low-k materials exhibit fundamentally weaker electrical and mechanical properties as compared to silicon oxide. Moreover, the low-k alternatives are typically susceptible to damage during the various interconnect processing steps. The damage observed in the low-k materials is manifested by an increase in the dielectric constant and increased moisture uptake, which may result in reduced performance and device reliability.

One way to overcome the integration challenges of low-k materials is to protect these low-k materials by adding at least one sacrificial hardmask layer onto a surface of the low-k material. While the hardmask layer serves to protect the low-k material, the presence of the sacrificial hardmask layer adds enormous process complexity as more film deposition, pattern transfer etch, and removal of hardmask layers are needed.

A state-of-the-art back-end-of-the-line (BEOL) integration process, called a low temperature oxide (LTO) process, employs up to eight layers of sacrificial hardmask materials to fabricate a two-layer dual-damascene interconnect structure. For example, a via-first LTO integration for forming a dual-damascene interconnect includes the steps of: depositing a dielectric material on a substrate including a patterned conductor; forming at least one via in the dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual-damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The integration schemes, such as the LTO ones mentioned above, are very complex, inefficient, and costly. For example, the via-first LTO integration scheme requires ten layers of films and twenty-one process steps to form a two-layer dual-damascene dielectric structure. In other words, 80% of films are not needed in the final interconnect structure.

Although immensely popular in semiconductor manufacturing, the prior art dual-damascene integration scheme described above suffers from several drawbacks including: First, it constitutes a signification portion of manufacturing cost of advanced semiconductor chips as many layers, up to twelve layers for the state-of-the-art chips, are required to connect the minuscule transistors within a chip and to the printed circuit board. Second, it is a main yield detractor as the many layers of films required to form the interconnects generate chances for defect introduction and, thus, degrade manufacturing yields. Third, it is very inefficient and embodies enormous complexity. The current dual-damascene integration scheme requires many sacrificial films (80% of the film stack) to pattern and protect the fragile interlayer dielectric films from damage during processing. These sacrificial patterning and protective films have to be removed after patterning and copper plating. Fourth, the performance gain by introduction of new lower-k materials is often offset by the needs for higher-k non-sacrificial materials, such as a cap layer, a hardmask layer, or a thicker copper barrier layer. Fifth, the prior art complex dual-damascene process lengthens manufacturing turn-around time and R&D development cycle. Sixth, the plasma etching process is an expensive and often unreliable process and requires significant up-front capital investment.

SUMMARY

The problems described above in prior art processes of fabricating interconnect (single-damascene and dual-damascene) structures are solved by using dramatically simplified integration methods of this invention. The present invention thus relates to methods of forming interconnect structures that are a permanent part of integrated circuits and microelectronic devices with photo-patternable low k materials combined with an oxygen-doped SiC antireflective coating (ARC). The oxygen-doped SiC ARC is a thin layer (i.e., less than 500 angstroms) present between a substrate and an overlying patterned and cured photo-patternable low k material. The oxygen-doped SiC ARC provides excellent adhesion to the adjacent layers of the integrated film stack and does not produce standing waves that may degrade the diffusion barrier and the electrically conductive feature that are embedded within the patterned and cured photo-patternable low k material and, as such, structural integrity is maintained. Moreover the inventive oxygen-doped SiC ARC further provides interconnect structures with improved reliability with its strong adhesion strength and improved pattern profile control. Furthermore, the inventive oxygen-doped SiC ARC further provides improved etching selectivity during its ARC open process with plasma etch thus reducing potential plasma damage to the patterned and cured photo-patternable low k material.

Additionally, the inventive oxygen-doped SiC ARC can withstand current back-end-of-the-line (BEOL) high temperature process conditions while conventional organic ARCs cannot. In some embodiments, the oxygen-doped SiC antireflective coating has a reduced absorbance at 193 nm as compared with an non-oxygen-doped SiC antireflective coating.

The invention described herein also circumvents the prior art drawbacks of traditional BEOL integration by combining the functions of a photoresist and a dielectric material into one single material. This one material, called a photo-patternable low k material (or PPLK material for short), acts as a photoresist during the lithographic patterning process, and as such, no separate photoresist is required. After lithographic patterning, the PPLK material is subsequently converted into a permanent on-chip low k material during a post patterning cure. In this way, the inventive methods avoid plasma etching of low k materials and the complex sacrificial film stack and processes required for patterning of low k materials.

In one embodiment of the invention, an interconnect structure is provided that includes at least one patterned and cured photo-patternable low k material located directly on a surface of a patterned oxygen-doped SiC antireflective coating. At least one conductively filled region is present within the at least one patterned and cured photo-patternable low k material and the patterned oxygen-doped SiC antireflective coating.

In another aspect of the invention, an interconnect structure is provided that includes a first patterned and cured first photo-patternable low k material located directly on a patterned oxygen-doped SiC antireflective coating and an overlying patterned and cured second photo-patternable low k material located on an upper surface of the patterned and cured first photo-patternable low k material. At least one conductively filled region is located in the patterned and cured first and second photo-patternable low k materials and the patterned oxygen-doped SiC antireflective coating.

In a further aspect of the invention, a method of fabricating an interconnect structure is provided that includes providing an oxygen-doped SiC antireflective coating atop a substrate. At least one photo-patternable low k material is provided directly on an upper surface of the oxygen-doped SiC antireflective coating. At least one interconnect pattern is formed, without utilizing a separate photoresist material, within the at least one photo-patternable low k material. The at least one patterned photo-patternable low k material is cured into a patterned and cured photo-patternable low k material. After curing, exposed portions of the oxygen-doped SiC antireflective coating are removed by etching forming an opening within the oxygen-doped SiC antireflective coating. The at least one interconnect pattern and the opening within the oxygen-doped SiC antireflective coating are then filled with an electrically conductive material.

In another embodiment of the single damascene integration of the invention, the exposed portions of the oxygen-doped SiC antireflective coating are removed by etching forming an opening within the oxygen-doped SiC antireflective coating prior to curing of the at least one patterned photo-patternable low k material and filling with an electrically conductive material.

In an even further aspect of the invention, a method of fabricating a dual damascene interconnect structure is provided that includes providing an oxygen-doped SiC antireflective coating atop a substrate. A first photo-patternable low k material is formed directly on a surface of the oxygen-doped SiC antireflective coating. At least one first interconnect pattern is formed within the first photo-patternable low k material without utilizing a separate photoresist. A second photo-patternable low k material is provided on top of the patterned first photo-patterned low k material and within the at least one first interconnect pattern. At least one second interconnect pattern is then formed within the second photo-patternable low k material without a separate photoresist. At least the second photo-patterned patternable low k material is cured. Exposed portions of the oxygen-doped SiC antireflective coating are then opened via etching, and the first and second interconnect patterns and the opening within the oxygen-doped SiC antireflective coating are filled with an electrically conductive material.

In another embodiment of the dual damascene integration of the invention, the exposed portions of the oxygen-doped SiC antireflective coating are removed by etching forming an opening within the oxygen-doped SiC antireflective coating immediately after forming the first patterns within the first photo-patternable low-k material and prior to curing the first patterned photo-patternable low k material.

In another embodiment of the dual damascene integration of the invention, the exposed portions of the oxygen-doped SiC antireflective coating are removed by etching forming an opening within the oxygen-doped SiC antireflective coating immediately after forming the second patternable low-k material and prior to curing the at least one patterned photo-patternable low k material and filling with an electrically conductive material.

DETAILED DESCRIPTION

The present invention, which provides semiconductor interconnect structures (single-damascene and dual-damascene) including a patterned and cured photo-patternable low k (PPLK) material as a permanent on-chip insulator and an underlying patterned oxygen-doped silicon carbide (SiC) antireflective coating (ARC) and methods of fabricating the same, will now be described in greater detail by referring to the following discussion and drawings that accompany the present application. It is noted that the drawings that accompany the present application are provided for illustrative purposes only, and, as such, these drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, methods for producing interconnect structures (singe-damascene and dual-damascene) for VLSI and ULSI devices using at least one photo-patternable low k (PPLK) material and an underlying oxygen-doped SiC antireflective coating are disclosed. The oxygen-doped SiC ARC is a thin layer (i.e., less than 500 angstroms) that provides excellent adhesion to the adjacent layers of the integrated film stack and does not produce standing waves that may degrade the diffusion barrier and the electrically conductive feature that are embedded within the patterned and cured photo-patternable low k material and, as such, structural integrity is maintained. Moreover the inventive oxygen-doped SiC ARC further provides interconnect structures with improved reliability with its strong adhesion strength and improved pattern profile control. Furthermore, the inventive oxygen-doped SiC ARC further provides improved etch selectivity during its ARC open process with plasma etch thus reducing potential plasma damage to the patterned and cured photo-patternable low k material. The inventive oxygen-doped SIC ARC can withstand current back-end-of-the-line (BEOL) high temperature process conditions.

It is noted that the PPLK materials employed in the invention are any dielectric materials possessing two functions. They act as a photoresist during a patterning process and are subsequently converted into a low-k dielectric insulator during a post patterning cure process. The cured product of a PPLK material, therefore, can serve as an permanent on-chip dielectric insulator. The photo-patternable low k material employed herein can be deposited from a liquid phase. In the present disclosure, the terms "cure" or "curing" are used interchangeable to refer one of the processes selected from a thermal cure, an electron beam cure, an ultra-violet (UV) cure, an ion beam cure, a plasma cure, a microwave cure or a combination thereof. A "cured" product of a photo-patternable low k material is the product of the photo-patternable low k material after it has undergone one of the aforementioned cure processes. The "cured" product of a photo-patternable low k material is different from the photo-patternable low k material in chemical nature and physical, mechanical and electrical properties.

The term "photo-patternable low k material (or PPLK for short)" includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described below.

In general terms, the PPLK material that can be employed is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the PPLK material may be a photo-patternable composition further comprising at least one microscopic pore generator (porogen). The pore generator may be or may not be photo/acid sensitive.

Illustrative polymers for the PPLK material include, but are not limited to, siloxane, silane, carbosilane, oxycarbosilane, silsesquioxane-type polymers including caged, linear, branched or combinations thereof. In one embodiment, the PPLK material is a photo-patternable composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009 all of which are incorporated herein by reference in their entirety.

The PPLK material is formed from a photo-patternable composition (negative-tone or positive-tone) that includes at least one of the above mentioned polymers, copolymers or blends, a photoacid generator, a base additive and a solvent typically used in a photoresist composition. When the PPLK material is a negative-tone photo-patternable material, it may be formed from a patternable composition optionally including an additional cross-linker. By "negative-tone" it is meant that the part of the PPLK material that is exposed to an actinic irradiation will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone photo-patternable material, it is formed from a patternable composition that includes at least one of the above mentioned polymers, copolymers or blends wherein the said polymers, copolymers or blends containing at least photo/acid imageable functional group to form positive-tone patterns, a photoacid generator, a base additive and a solvent typically used in a photoresists. By 'positive-tone" it is meant that the part of the PPLK material that is exposed to an actinic irradiation will be removed by a conventional developer, while the unexposed part of the PPLK material is not removed. The photoacid generators, base additives and solvents are well known to those skilled in the art and, as such, details regarding those components are not fully provided.

Figure 1:
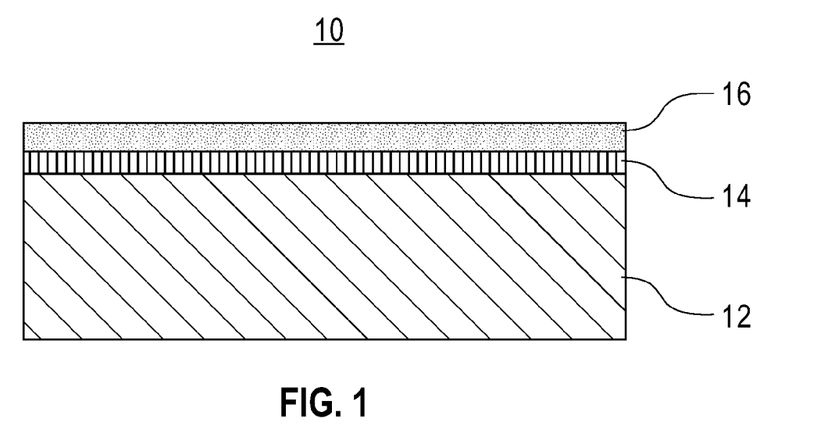
FIG. 1 is a pictorial representation (through a cross sectional view) illustrating an initial structure that is employed in one embodiment of the invention including an oxygen-doped SiC ARC located atop a substrate.

Reference is now made to FIG. 1 which illustrates an initial structure 10 that can be employed in one embodiment of the invention. The initial structure 10 of FIG. 1 includes a substrate 12, a dielectric cap 14 located on an upper surface of substrate 12 and an oxygen-doped SiC antireflective coating (ARC) 16 located on an upper surface of the dielectric cap 14. In some embodiments, not shown herein, the dielectric cap 14 is not present and thus the oxygen-doped SiC ARC 16 is located directly on an upper surface of substrate 12.

The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride, carbon nanotubes, graphene or combinations thereof including multilayers.

Atop the substrate 12 is the optional dielectric cap 14 and the oxygen-doped SiC ARC 16. When present, the dielectric cap 14 is formed directly on the surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The dielectric cap 14 may comprise any suitable dielectric capping material such as, for example, SiC, SiN, $SiO_2$, a carbon doped oxide, a nitrogen and hydrogen doped silicon carbide SiC(N,H) or multilayers thereof. The dielectric cap 14 can be a continuous layer or a discontinuous layer. The dielectric cap 14 can be a layer with graded composition in the vertical direction. It can also be a select cap, such as CoWP.

A post deposition treatment may be applied to the dielectric cap 14 to modify the properties of either the entire layer or the surface of the dielectric cap 14. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the dielectric cap 14, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 12 can withstand, usually 500° C. This heat treatment can be conducted in an inert environment or within a chemical environment in a gas phase or a liquid phase. This treatment step may or may not be performed in the same tool as that used in forming the dielectric cap 14.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present disclosure: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the dielectric cap 14.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the dielectric cap 14.

The post deposition chemical treatment may be conducted in a gas phase or a liquid phase. The following conditions may be employed for this aspect of the present disclosure: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap 14, such as adhesion strength. This chemical treatment may penetrate the entire dielectric cap 14 or is limited only to the surface of the dielectric cap 14. Example chemicals include adhesion promoters such as silanes, siloxanes and silylation agents. This treatment step may or may not be performed in the same tool as that used in forming the dielectric cap 14.

The thickness of the dielectric cap 14 may vary depending on the technique used to form the same as well as the material make-up of the layer. Typically, the dielectric cap 14 has a thickness from 1 nm to 100 nm, with a thickness from 20 nm to 45 nm being more typical.

The initial structure 10 shown in FIG. 1 also includes an oxygen-doped SIC antireflective coating (ARC) 16 that is present either directly on an upper surface of dielectric cap 14, if present, or directly on an upper surface of substrate 10 when the dielectric cap 14 is not present. The oxygen-doped SiC ARC 16 is a thin layer (i.e., less than 500 angstroms) that provides excellent adhesion to the adjacent layers of the integrated film stack and does not produce standing waves that may degrade the diffusion barrier and the electrically conductive feature that are embedded within the patterned and cured photo-patternable low k material and, as such, structural integrity is maintained. Moreover the oxygen-doped SiC ARC 16 further provides interconnect structures with improved reliability with its strong adhesion strength and improved pattern profile control. Furthermore, the oxygen-doped SiC ARC 16 further provides improved etch selectivity during its ARC open process with plasma etch thus reducing potential plasma damage to the patterned and cured photo-patternable low k material. The oxygen-doped. SiC ARC 16 can withstand current back-end-of-the-line (BEOL) high temperature process conditions. In some embodiments, the oxygen-doped SiC antireflective coating 16 has a reduced absorbance at 193 nm as compared with a non-oxygen-doped SiC antireflective coating.

The oxygen-doped SiC ARC 16 employed in the present disclosure has the following general ARC characteristics: (i) It acts as an antireflective coating (ARC) during a lithographic patterning process. (ii) It withstands high-temperature BEOL integration processing (up to 500° C.); (iii) It prevents resist (e.g., the photo-patternable low k material) poisoning by the substrate; (iv) It provides vertical wall profile and sufficient etch selectivity between the photo-patternable low k material and the ARC layer; (v) It serves as a permanent dielectric layer in a chip and has a dielectric constant of less than 7.0; and (vi) It is compatible with conventional BEOL integration and produces reliable hardware. These properties are discussed in greater detail below.

Characteristic (i), the oxygen-doped SiC ARC 16 acts as an antireflective coating (ARC) during a lithographic patterning process: The oxygen-doped SiC ARC 16 may be designed to control reflection of light that is transmitted through the photo-patternable low k material (to be subsequently formed), reflected off the substrate and back into the photo-patternable low k material, where it can interfere with incoming light and cause the photo-patternable low k material to be unevenly exposed (along the vertical direction). The optical constant of the oxygen-doped SiC ARC 16 is defined here as the index of refraction n and the extinction coefficient k. In general, the oxygen-doped SiC ARC 16 can be modeled so as to find optimum optical parameters (n and k values) of an ARC as well as optimum thickness. The optical constants of the oxygen-doped SiC ARC 16 are typically in the range from n=1.0 to n=4.5 and k=0.01 to k=3.0, with n=1.5 to n=2.5 and k=0.1 to k=1.00 being more typical, at a wavelength of 365, 248, 193 and 157, 126 nm and extreme ultraviolet (13.4 nm) radiation. The optical properties and thickness of the oxygen-doped SiC ARC 16 are optimized to obtain optimal resolution and profile control of the photo-patternable low k material during the subsequent patterning steps, which is well known to those ordinarily skilled in the art.

Characteristic (ii), i.e., the oxygen-doped SiC ARC 16 can withstand high-temperature BEOL integration processing (up to 500° C.): The oxygen-doped SiC ARC 16 must withstand the harsh processing conditions during BEOL integration. These include high temperature and intense UV curing. The process temperature can be as high as 450° C. The intensity of the light used in the UV cure process can be as high as tens of $J/cm^2$.

Characteristic (iii), i.e., oxygen-doped SiC ARC 16 prevents resist (e.g., photo-patternable low k material) poisoning by the substrate: The photo-patternable low k materials employed are preferably chemically amplified resists. They can be poisoned by any basic contaminant from the underlying substrate 12 or from the dielectric cap 14. As such, the oxygen-doped SiC ARC 16 must serve as an additional barrier layer to prevent basic contaminant from the underlying substrate and the optional dielectric cap 14 from diffusing into the photo-patternable low k material to poison the chemically amplified photo-patternable low k material.

Characteristic (iv), i.e., the oxygen-doped SIC ARC 16 provides vertical wall profile and sufficient etch selectivity between the photo-patternable low k material and the oxygen-doped SiC ARC 16: The oxygen-doped SiC ARC 16 should provide sufficient reflectivity control with reflectivity from the underlying substrate under a particular lithographic wavelength of less than 8%, preferably less than 5%, more preferably less than 2% and generate vertical side wafer profile. The oxygen-doped SiC ARC 16 should also generate residue-free patterns with no footing. Moreover, the adhesion of the photo-patternable low k material should be sufficient to prevent pattern collapse during patterning and a subsequent UV cure. The oxygen-doped SiC ARC 16 is designed with an improved etch selectivity during the ARC/dielectric cap opening process as compared with undoped silicon carbide (SiC) so that the opening of the ARC/dielectric cap does not erode significant portion of the photo-patternable low k material and degrade significantly its pattern profile. An etch selectivity (etch rate ratio of oxygen-doped SiC ARC 16 versus the photo-patternable low k material) is greater than 1, preferably greater than 5, more preferably greater than 10.

Characteristic (v), i.e., the oxygen-doped SiC ARC 16 serves as a permanent dielectric layer in a chip: The oxygen-doped SiC ARC 16 remains after patterning and cure of the photo-patternable low k material. It serves as a permanent dielectric layer in a chip. Therefore, the oxygen-doped SiC ARC 16 (after cure) must meet the requirements of an on-chip dielectric insulator, including electrical properties (low dielectric constant: preferably k less than 7.0, and more preferably k less than 5.0; dielectric breakdown field: greater than 2 MV/cm, preferably greater than 4 MV/cm, and more preferably greater than 6 MV/cm, leakage: less than $10^{-5}$ $A/cm^2$, preferably less than $10^{-7}$ $A/cm^2$, and more preferably less than $10^{-9}$ $A/cm^2$); mechanical properties (adhesion energy is equal to or greater than the cohesive energy of the weakest layer of the integrated film stack); must pass electrical and mechanical reliability tests.

The oxygen-doped SiC ARC 16 is formed utilizing a deposition process such as, for example, chemical vapor deposition (CVD), plasma enhanced chemical vapor deposition (PECVD), atomic layer deposition (ALD), plasma enhanced atomic layer deposition (PEALD), chemical solution deposition, and evaporation. In one embodiment of the invention, CVD is used in forming the oxygen-doped SiC ARC 16. In another embodiment, PECVD is employed in forming the oxygen-doped SiC ARC 16. In yet another embodiment, PEALD is employed in forming the oxygen-doped SiC ARC 16. The oxygen-doped SiC ARC 16 typically has a thickness from 0.5 nm to 100 nm, with a thickness from 1 nm to 50 nm being more typical.

In depositing the oxygen-doped SiC ARC 16, at least an oxygen dopant source is employed. By "oxygen dopant source" it is meant a precursor (compound) that contains oxygen. Suitable oxygen dopant sources that can be used in forming the oxygen-doped SiC ARC 16 can be selected from oxygen, NO, $N_2O$, CO, $CO_2$, $SiO_2$, ozone or any combination thereof. In one embodiment, $N_2O$ is employed as the oxygen dopant source.

The oxygen-doped SiC ARC 16 is also formed utilizing a C source (i.e., a precursor including C) and a Si source (i.e., a precursor including Si), or a combined C and Si source (i.e., a precursor including both C and Si).

The carbon precursor source can be selected from alkanes, alkenes, alkynes and mixtures thereof. The carbon precursor sources may be linear, branched, and/or cyclic.

The term "alkane" denotes a chemical compound that consists only of the elements carbon and hydrogen (i.e., hydrocarbons), wherein these atoms are linked together exclusively by single bonds (i.e., they are saturated compounds). In one embodiment, the alkane includes from 1 to 22, typically from 1 to 16, more typically, from 1 to 12 carbon atoms.

The term "alkene" denotes an unsaturated chemical compound containing at least one carbon-to-carbon double bond. In one embodiment, the alkene is an acyclic alkene, with only one double bond and no other functional groups. In such an embodiment, the acylic alkene forms a homologous series of hydrocarbons with the general formula $C_nH_{2n}$, wherein n is an integer from 2 to 22, typically 2 to 16, more typically 2 to 12 carbon atoms.

The term "alkyne" denotes a hydrocarbon that has a triple bond between two carbon atoms, with the formula $C_nH_{2n-2}$, wherein n is an integer from 2 to 22, typically 2 to 16, more typically 2 to 12 carbon atoms. Alkynes are traditionally known as acetylenes.

Some examples of typical carbon precursor sources that can be employed include, but are not limited to, methane, ethane, propane, ethylene, propylene, butene, acetylene, and/or methyl acetylene.

When a Si source is employed in forming the oxygen-doped SiC ARC 16, the Si source can include, but it is not limited to, any silicon precursor including silane ($SiH_4$) derivatives having the molecular formula $Si\,RR^1R^2R^3$, where R, $R^{1-3}$ may or may not be identical and are selected from H, alkyl, phenyl, vinyl, allyl, alkenyl or alkynyl groups that may be linear, branched, cyclic, or polycyclic. Silicon precursors that can be employed include, but are not limited to, silane, dicholorosilane methylsilane, dimethylsilane, trimethylsilane, tetramethylsilane, ethylsilane, diethylsilane, triethylsilane, tetraethylsilane, vinylsilane and disilane.

When a combined C and Si source is employed in forming the oxygen-doped SiC ARC 16, the combined C and Si source can include, but it is not limited to, alkyl silanes such as, for example methyl silane, dimethylsilane, trimethylsilane, tetramethylsilane, ethylsilane, diethylsilane, triethylsilane. In one embodiment, the combined C and Si source is trimethyl silane, TMS.

The various sources mentioned above can be provided to a deposition reactor individual or as a mixture. In either embodiment, the various sources or mixture thereof can be used neat or be diluted with an inert gas such as, for example, He and/or Ar.

The concentration of oxygen dopant present in the oxygen-doped SiC ARC 16 is typically within a range from 0.1 atomic percent to 95 atomic percent, with a concentration of oxygen from 1 atomic percent to 50 atomic percent being even more typical. The silicon concentration present in the oxygen-doped SiC ARC 16 is typically within a range from 1 atomic percent to 99 atomic percent, with a concentration of silicon from 5 atomic percent to 70 atomic percent being even more typical. The carbon concentration present in the oxygen-doped SiC ARC 16 is typically within a range from 1 atomic percent to 99 atomic percent, with a concentration of carbon from 5 atomic percent to 70 atomic percent being even more typical.

The inventive oxygen-doped SiC ARC 16 may also comprise other elements including Ge, B, Sn, Fe, Ta, Ti, Ni, Hf, La, N, S, F or mixtures thereof.

In some embodiments, the method may further include the step of providing a parallel plate reactor, which has an area of a substrate chuck from 85 cm$^2$ to 750 cm$^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of oxygen-doped SiC ARC 16. In one embodiment, the conditions used for providing the oxygen-doped SiC ARC include: setting the substrate temperature within a range from 100° C. to 700° C.; setting the high frequency RF power density within a range from 0.1 W/cm$^2$ to 2.0 W/cm$^2$; setting the gas flow rates within a range from 5 sccm to 10000 sccm, setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of the various sources, i.e., precursors, mentioned above are flowed into the reactor at a flow rate within a range from 10 sccm to 1000 sccm. While gas precursors are used in the above example, liquid precursors may also be used for the deposition. Following the deposition of the oxygen-doped SiC ARC 16, the ARC can be subjected to one of the post deposition treatments mentioned above for the optional dielectric cap 14.

Figure 2:
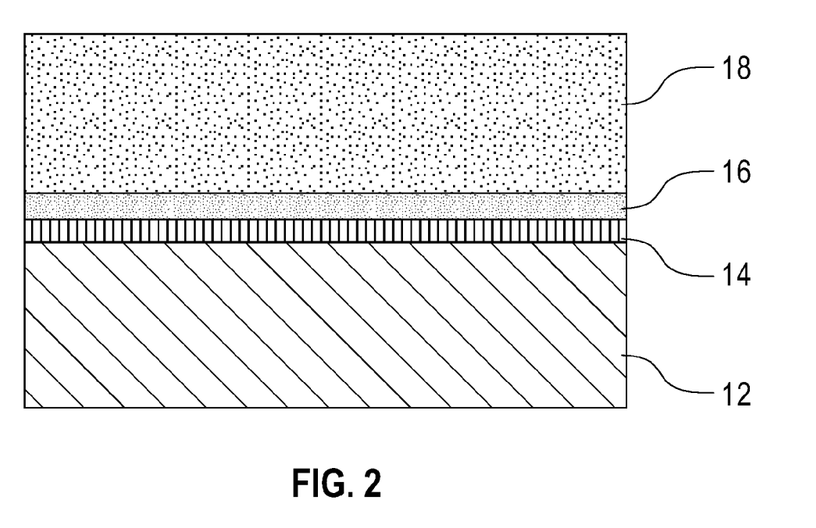
FIG. 2 is a pictorial representation (through a cross sectional view) illustrating the structure shown in FIG. 1 after forming a first photo-patternable low k (PPLK) material directly on an upper surface of the oxygen-doped SiC ARC.

Reference is now made to FIG. 2, which illustrates the structure of FIG. 1 after forming a first photo-patternable low k (PPLK) material 18 atop the upper surface of the oxygen-doped SiC ARC 16. The first PPLK material 18 includes one of the PPLK materials described above. In one embodiment, a positive-tone photo-patternable low k composition is employed for via patterning. Either a positive-tone or a negative-tone photo-patternable low k composition is used for line patterning.

The first PPLK material 18 is provided (i.e., formed) utilizing a deposition process including, for example, spin-on-coating, dip coating, brush coating, blade coating, and ink-jet dispensing. After applying the first PPLK material 18, a post deposition baking step is typically, but not necessarily always, required to remove unwanted components, such as solvent. When performed, the baking step can be conducted at a temperature from 40° C. to 200° C., with a baking temperature from 60° C. to 140° C. being even more preferred. The duration of the baking step varies from 10 seconds to 600 seconds and is not critical herein.

The thickness of the first PPLK material 18 may vary depending on the requirement of the chip and the technique used to form the same as well as the material make-up of the layer. Typically, the first PPLK material 18 has a thickness from 1 nm to 50000 nm, with a thickness from 10 nm to 5000 nm being more typical.

Figure 3:
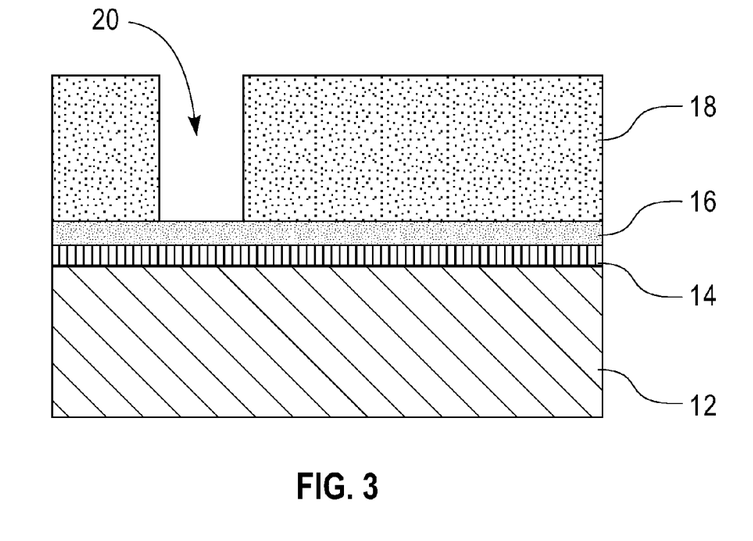
FIG. 3 is a pictorial representation (through a cross sectional view) illustrating the structure shown in FIG. 2 after formation of a via pattern within the first PPLK material.

Referring to FIG. 3, the first PPLK material 18 is patternwise exposed to form latent images of a desired circuitry. An optional post-exposure baking may be required to effect the photochemical reactions. When performed, the baking step is conducted at a temperature from 60° to 200° C., with a baking temperature from 80° to 140° C. being even more typical. The duration of the baking step varies and is not critical to the practice of the present invention. After exposure and post-exposure baking, the latent images are developed into the relief images with an appropriate developer, usually an aqueous base solution, such as 0.26N tetramethylammoniahydroxide (TMAH) solution.

The pattern wise exposing process can be accomplished in a variety of ways, including, for example, through a mask with a lithography stepper or a scanner with an exposure light source of G-line, I-line (365 nm), DUV (248 nm, 193 nm, 157 nm, 126 nm), Extreme UV (13.4 nm), or an electron beam, an ion beam. The exposing process may be performed in a dry mode or an immersion mode. The pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

FIG. 3 specifically illustrates the structure that is formed after forming at least one first interconnect pattern 20 within the first PPLK material 18. The at least one first interconnect pattern 20 may include at least one via opening (as shown and as preferred) or at least one line opening (not shown and less preferred than forming a via opening at this stage of the process. method). As shown, the at least one first interconnect pattern 20 exposes a surface of the oxygen-doped SiC ARC 16.

Figure 4:
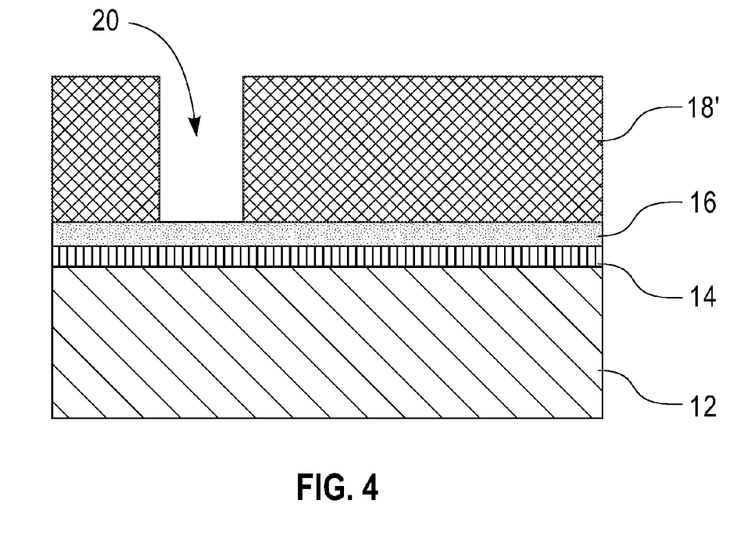
FIG. 4 is a pictorial representation (through a cross sectional view) illustrating the structure of FIG. 3 after performing an optional freezing, i.e., curing, step.

After forming the at least one first interconnect pattern 20, the first PPLK material is typically, but not necessarily always cured to form a patterned and cured first PPLK material 18' such as is shown, for example, in FIG. 4. The curing is optional when the first PPLK material 18 is negative-tone, but it is required when the first PPK material 18 is a positive-tone material. Curing is performed by a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the photo-patternable low k material into a low k film and maintains pattern fidelity.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He and Ar. Typically, the UV/thermal cure temperature is from 100° C. to 500° C., with a cure temperature from 300° C. to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials. This post-patterning cure, if performed, may be in different or the same tool cluster as that of the patterning step.

In another embodiment, the exposed oxygen-doped ARC is opened by plasma etching immediately after forming the first interconnect pattern within the first PPLK material.

Figure 5:
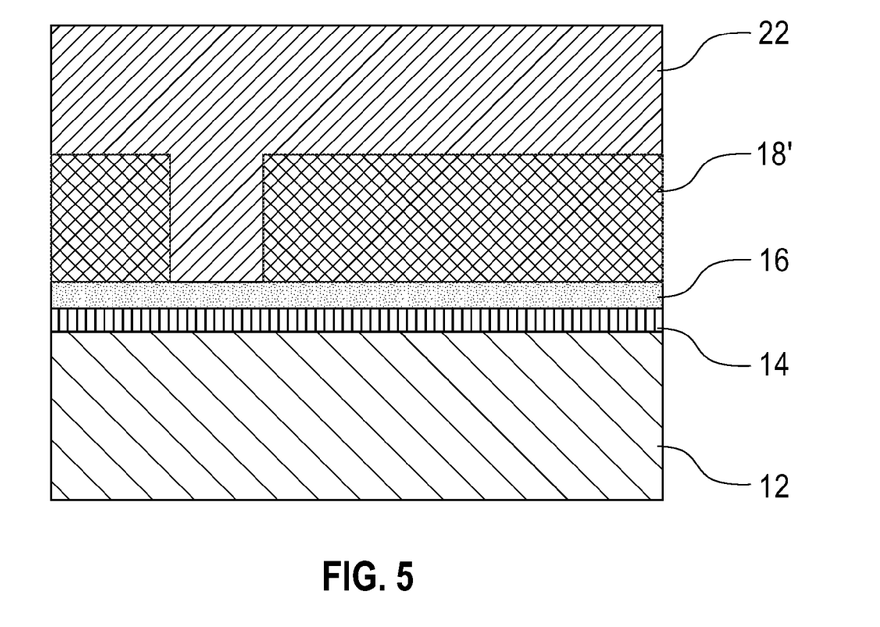
FIG. 5 is a pictorial representation (through a cross sectional view) illustrating the structure shown in FIG. 4 after forming a second PPLK material over the entire surface of patterned and cured first PPLK material.

After patterning and optionally curing the first PPLK material, a second PPLK material 22 is formed providing the structure shown in FIG. 5. In FIG. 5, the second PPLK material 22 is formed atop the patterned and cured first PPLK material 18' as well as within the at least one interconnect pattern 20. In the embodiment in which the first PPLK material is patterned, but not cured, the second PPLK material would be formed atop the patterned first PPLK material as well as within the at least one interconnect pattern 20.

The second PPLK material 22 may comprise the same or different material as the first PPLK material 18. In general terms, the nature, the composition, and method of formulation mentioned above for the first PPLK material 18 are each applicable here for the second PPLK material 22. The deposition processes and thickness mentioned above for the first PPLK material 18 are also each applicable here for the second PPLK material 22.

Figure 6:
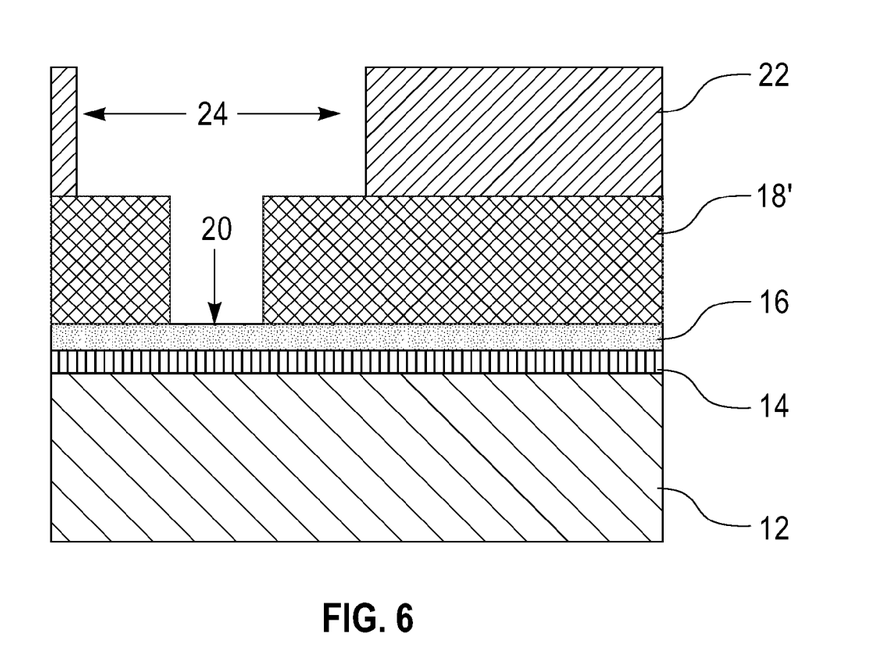
FIG. 6 is a pictorial representation (through a cross sectional view) illustrating the structure shown in FIG. 5 after forming a trench pattern within the second PPLK material and recovering the via within the patterned and cured first PPLK material.

Referring now to FIG. 6, the second PPLK material 22 is patterned to include at least one second interconnect pattern 24. The patterning of the second PPLK material 22 is performed utilizing the same basic processing equipment, steps and conditions as those used for patterning the first PPLK material 18. In the illustrated embodiment, the at least one second interconnect pattern 24 is typically a line (trench). The at least one second interconnect pattern 24 may also be a via, when the at least one first interconnect pattern 20 is a line. It is noted that the at least one first interconnect pattern 20 formed within the first PPLK material 18 and subsequently filled when the second PPLK material 22 is also recovered during this step of the invention. It is also noted that one of the at least one second interconnect patterns 24 is located above and in contact with one of the at least one first interconnect patterns 20.

Figure 7:
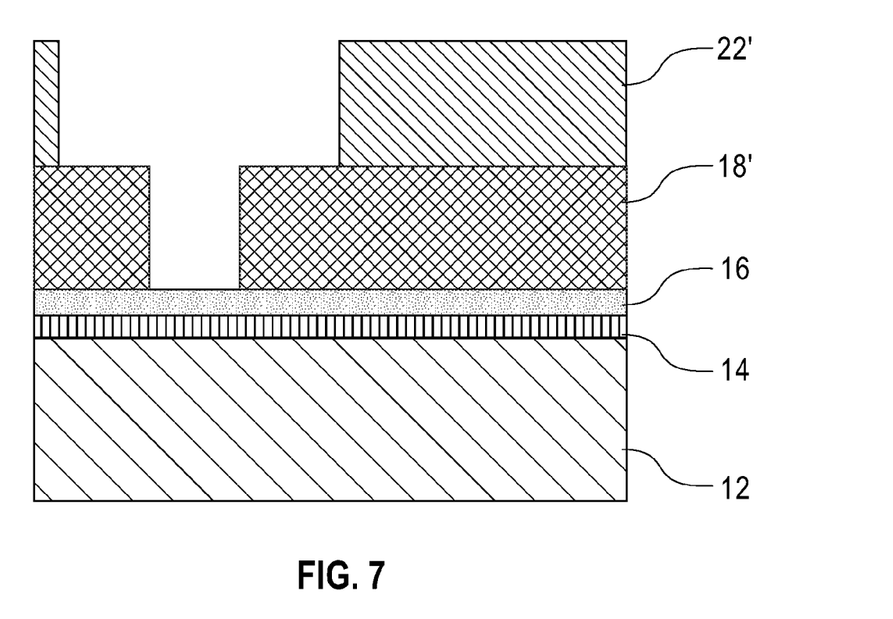
FIG. 7 is a pictorial representation (through a cross sectional view) illustrating the structure shown in FIG. 6 after curing of at least the patterned second PPLK material.

After patterning the second PPLK material 22, a curing step is performed that provides the structure such as shown, for example, in FIG. 7. In FIG. 7, reference numeral 22' denotes the patterned and cured second PPLK material. Like the first patterned and cured first PPLK material 18', the patterned and cured second PPLK material 22' has a relative dielectric constant usually less than 4.3. If not previously cured, this curing step also cures the patterned first PPLK material into a patterned and cured first PPLK material 18'. The cure methods, equipment and processes mentioned above for the first PPLK material 18 are each applicable here for the second PPLK material 22.

Figure 8:
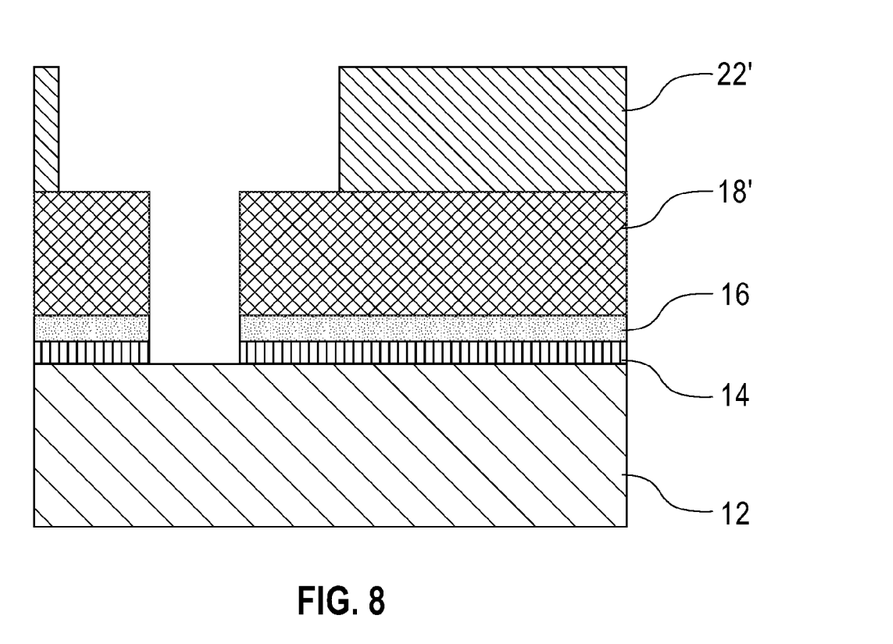
FIG. 8 is a pictorial representation (through a cross sectional view) illustrating the structure shown in FIG. 7 after opening of the underlying oxygen-doped SIC ARC.

Referring to FIG. 8, there is shown the structure of FIG. 7 after an etching step is performed that etches through, i.e., opens, at least the oxygen-doped SiC ARC 16. In embodiments in which a dielectric cap is present beneath the oxygen-doped SiC ARC, this step of the invention can also be employed to open the underlying dielectric cap 14. The etching step to 'open' the oxygen-doped SiC ARC and, if present, the dielectric cap 14, includes any etching process such as, for example, reactive ion etching or gas cluster ion beam etching.

In another embodiment, the exposure oxygen-doped ARC 16 is opened with a plasma etch immediately after forming the second pattern within PPLK and prior to curing. In this particular embodiment, any conventional plasma etching process can be employed.

A diffusion barrier layer (liner) (not shown), which may comprise Ta, TaN, Ti, TiN, Ru, RuTaN, RuTa, W, WN or any other material that can serve as a barrier to prevent electrically conductive material from diffusing through, is typically formed into the at least one first interconnect pattern 20 and the at least one second interconnect pattern 24 as well as within the opened ARC/dielectric cap stack by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 7 to 20 nm being more typical.

Following the formation of the diffusion barrier layer (liner), the remaining region of the at least one first interconnect pattern 20 and the at least one second interconnect pattern 24 as well as within the opened ARC/dielectric cap stack is filled with an electrically conductive material 26 forming a conductive feature. The electrically conductive material 26 used in forming the conductive feature includes, for example, polySi, an electrically conductive metal, an alloy comprising at least one electrically conductive metal, an electrically conductive metal silicide, an electrically conductive nanotube or nanowire, grapheme or combinations thereof. Preferably, the electrically conductive material 26 that is used in forming the conductive feature is a conductive metal such as Cu, W or Al, with Cu or a Cu alloy (such as AlCu) being highly preferred in the present invention. The electrically conductive material 26 is filled into the remaining first and second interconnect patterns utilizing a conventional deposition process including, but not limited to CVD, PECVD, sputtering, chemical solution deposition or plating. A preferred filling method is electrochemical plating.

After deposition, a conventional planarization process such as, for example, chemical mechanical polishing (CMP) can be used to provide a structure in which the diffusion barrier layer and the electrically conductive material 26 each have an upper surface that is substantially coplanar with the upper surface of the patterned and cured second PPLK material 22'. The resultant structure after electrically conductive material fill and planarization is shown, for example, in FIG. 9.

Figure 9:
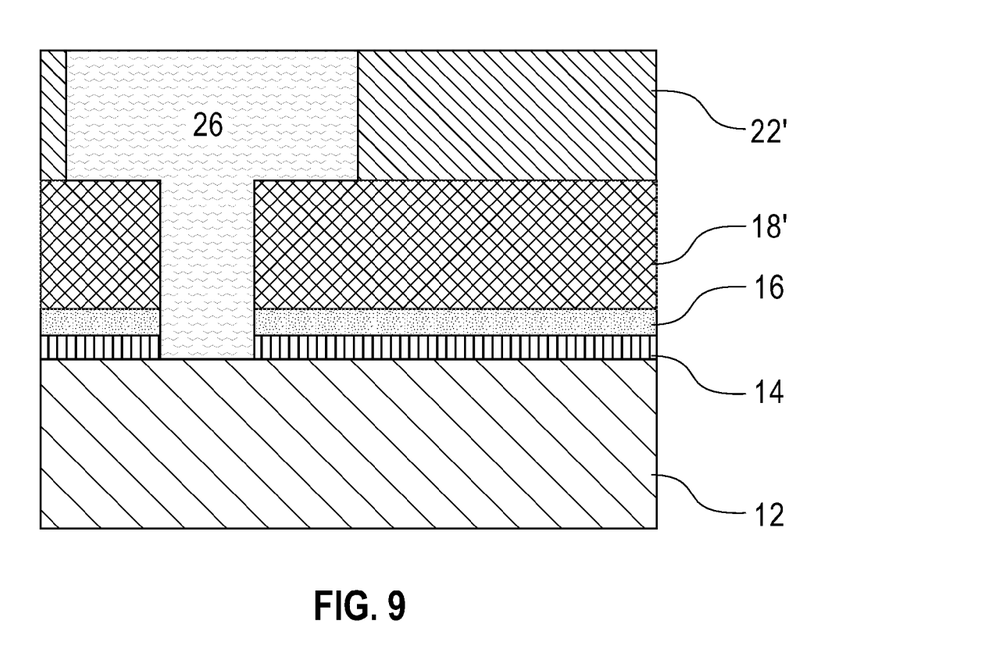
FIG. 9 is a pictorial representation (through a cross sectional view) illustrating the structure shown in FIG. 8 after conductive fill and planarization.
Figure 10:
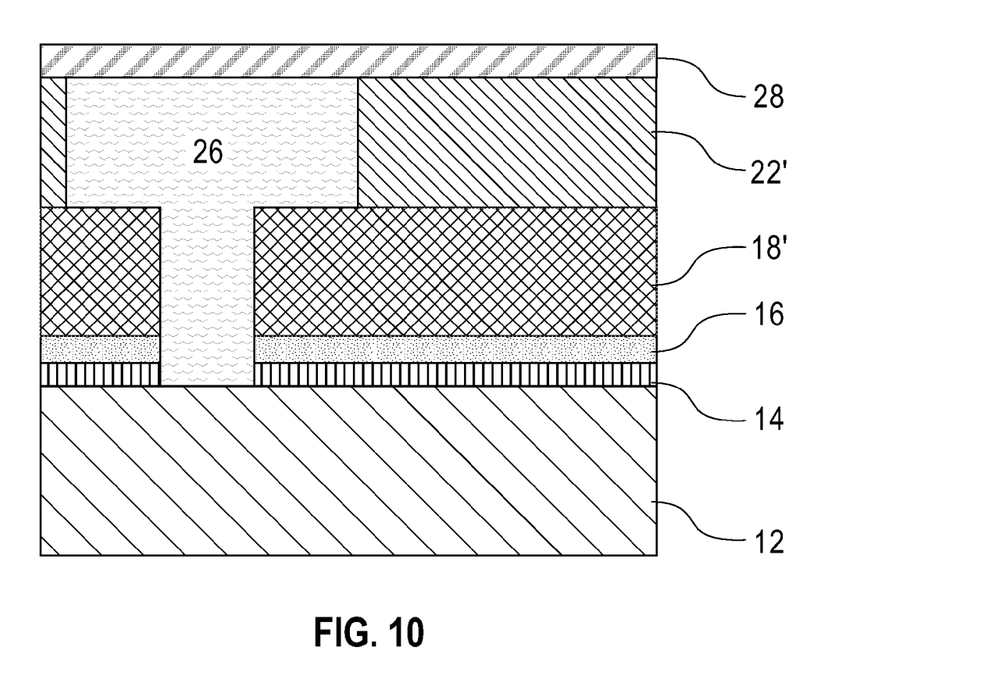
FIG. 10 is a pictorial representation (through a cross sectional view) illustrating the structure shown in FIG. 9 after forming a dielectric cap layer atop the exposed surfaces thereof.

After forming the structure shown in FIG. 9, another dielectric cap 28 can be formed on the surface of the patterned and cured second PPLK material 22' as well as atop an upper surface of the electrically conductive material 26. The structure including another dielectric cap 28 is shown in FIG. 10. The another dielectric cap 28 can be formed utilizing the methods described above for optional dielectric cap 14 and the another dielectric cap 28 can comprise the same or different composition as the optional dielectric cap 14.

In some embodiments not illustrated, a block mask can be formed atop the another dielectric cap 28 utilizing any conventional deposition process including, for example, CVD, PECVD and spin-on coating. The block mask can comprise a standard photoresist material including inorganic, organic and hybrid resists. The block mask can further comprise at least one anti-reflective coating layer and/or at least one hardmask layer. The composition of the anti-reflective coating layer and the hardmask layer can be organic, inorganic or organic/inorganic hybrid materials as long as the combination of their composition and layer thickness satisfies the patterning and pattern transfer needs of a subsequent air gap. In this particular embodiment, the another dielectric cap 28 and block mask are patterned providing an air gap pattern therein. The patterning step includes optical lithography, immersion lithography, EUV, soft lithography, contact printing, nanoprinting, E-Beam, maskless direct writing, scanning probe lithography, self-assemble lithography and directed self-assemble lithography. Note that the feature size of the air gap pattern is less than the dielectric spacing within the PPLK materials. The patterning step also includes etching such as reactive-ion etching. The air gap pattern can be transferred into at least the patterned and cured second PPLK material 22' utilizing a timed etching process such as, for example, reactive ion etching. After transferring the air gap pattern into at least the patterned and cured second PPLK material, an air gap is formed in the patterned and cured second PPLK material 22' by selectively removing part of the patterned and cured second PPLK material 22'. The remaining block mask is then removed from the structure utilizing a conventional removal method of sacrificial materials such as reactive ion etching, stopping atop the remaining another dielectric cap 28. In this embodiment, the transferred air gap pattern is adjacent to, but not directly abutting regions including the electrically conductive material 26 formed into the patterned and cured second PPLK material 22'. The air gap pattern may also be extended into the patterned and cured first PPLK material 18'.

After transferring the air gap pattern into at least the patterned and cured second PPLK material 22', portions of the patterned and cured second PPLK material 22' are directly abutting the air gap pattern are changed physically, chemically or both so as to have a different removal rate as compared to the remaining patterned and cured second PPLK material. This change in removal rate is achieved in the present application, by a chemical treatment, exposure to a reducing or an oxidizing plasma. One preferred embodiment of this material transformation is by an isotropic reactive ion etching. The isotropic ion etching gas chemistry is selected from at least one of $O_2$, CO, $CO_2$, $N_2$, $H_2$, $NH_3$, He, Ar, hydrocarbon and the like. This changed portion of the patterned and cured second PPLK material directly abutting the air gap pattern opening is then removed utilizing an etching process such as, for example, an isotropic etch utilizing a dilute HF etchant. A supercritical fluid etching process may also be used in some embodiments of the invention. These two steps, e.g., changing the etch selectivity of portions of the patterned and cured second PPLK material and etching, provides an air gap within the structure. The air gap may include air or a vacuum. A pump may be used to remove the air from the air gap to form a vacuum. An air gap cap can be formed atop the remaining another dielectric cap 28 sealing the air gap in the structure. The air gap cap can include an ARC including a conventional inorganic ARC.

Figure 11:
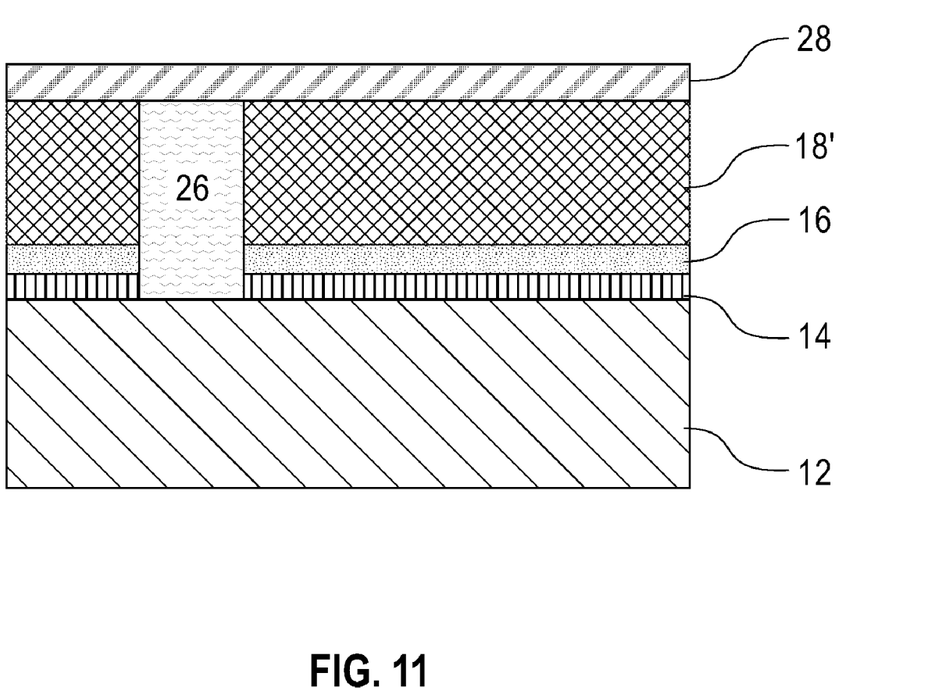
FIG. 11 is a pictorial representation (through a cross sectional view) of a single-damascene structure that can be formed utilizing the structure shown in FIG. 2 and subjecting that structure to interconnect patterning, conductive fill, and planarization.

In addition to the dual-damascene embodiment mentioned above, the present invention also contemplates a single-damascene embodiment. The single-damascene method includes the same basic processing steps as described above for the dual-damascene process except that a second PPLK material is not introduced into the process. The resultant structure for this embodiment of the invention is illustrated in FIG. 11 of the present application. In FIG. 11, like reference numerals are used to define like elements that are present in both the single and dual damascene embodiments.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
at least one patterned and cured photo-patternable low k material located directly on a surface of a patterned oxygen-doped SiC antireflective coating, wherein said at least one patterned and cured photo-patternable low k material and said patterned oxygen-doped SiC antireflective coating each have at least one conductively filled region therein, and wherein said patterned oxygen-doped SiC antireflective coating has an index of refraction n from 1.0 to 4.5 and an extinction coefficient k from 0.01 to 3.0 at a wavelength of 193 nm, and wherein said patterned oxygen-doped SiC antireflective coating provides a control of reflectivity from an underlying substrate of less than 8% and has an etch rate ratio versus the photo-patternable low k material that is greater than 1.

2. The interconnect structure of claim 1 wherein said at least one patterned and cured photo-patterned low k material is a cured product of a photo-patternable composition comprising a functionalized polymer, copolymer, or a blend including at least two of any combination of polymers and/or copolymers having one or more photo/acid-sensitive imageable groups.

3. The interconnect structure of claim 1 wherein said at least one patterned and cured photo-patterned low k material further comprises at least one air gap.

4. The interconnect structure of claim 1 wherein said patterned oxygen-doped SiC antireflective coating further comprises Ge, B, Sn, Fe, Ta, Ti, Ni, Hf, La, N, S, F or mixtures thereof.

5. The interconnect structure of claim 1 wherein said patterned oxygen-doped SiC antireflective coating has an oxygen dopant concentration from 0.1 atomic percent to 95 atomic percent.

6. The interconnect structure of claim 1 wherein said underlying substrate includes a patterned dielectric cap.

7. The interconnect structure of claim 1 further comprising a dielectric cap located atop the at least one patterned and cured photo-patternable low k material and atop an upper surface of the at least one conductively filled region.

8. The interconnect structure of claim 1 wherein an upper surface of the at least one patterned and cured photo-patternable low k material is coplanar with an upper surface of the at least one conductively filled region.

9. The interconnect structure of claim 1 wherein said oxygen-doped SiC antireflective coating has a breakdown field of greater than 2 MV/cm, and a leakage of less than $10^{-5}$ A/cm$^2$.

10. The interconnect structure of claim 1 where the extinction coefficient k is from 0.1 to 1 at 193 nm.

11. An interconnect structure comprising:
a patterned and cured first photo-patternable low k material located directly on a patterned oxygen-doped SiC antireflective coating and an overlying patterned and cured second photo-patternable low k material located on an upper surface of said patterned and cured first photo-patternable low k material, said patterned and cured first and second photo-patternable low k materials and said patterned oxygen-doped SiC antireflective coating each having at least one conductively filled region therein, and wherein said patterned oxygen-doped SiC antireflective coating has an index of refraction n from 1.0 to 4.5 and an extinction coefficient k from 0.01 to 3.0 at a wavelength of 193 nm, and wherein said patterned oxygen-doped SiC antireflective coating provides a control of reflectivity from an underlying substrate of less than 8% and has an etch rate ratio versus the first photo-patternable low k material that is greater than 1.

12. The interconnect structure of claim 11 wherein said patterned and cured first photo-patterned low k material and said patterned and cured second photo-patternable low k material are each a cured product of a photo-patternable composition comprising a functionalized polymer, copolymer, or a blend including at least two of any combination of polymers and/or copolymers having one or more photo/acid-sensitive imageable groups.

13. The interconnect structure of claim 11 wherein said at least one patterned and cured photo-patterned low k material further comprises at least one air gap.

14. The interconnect structure of claim 11 wherein said patterned oxygen-doped SiC antireflective coating further comprises Ge, B, Sn, Fe, Ta, Ti, Ni, Hf, La, N, S, F or mixtures thereof.

15. The interconnect structure of claim 11 wherein said patterned oxygen-doped SiC antireflective coating has an oxygen dopant concentration from 0.1 atomic percent to 95 atomic percent.

16. The interconnect structure of claim 11 wherein said underlying substrate includes a patterned dielectric cap.

17. The interconnect structure of claim 11 further comprising a dielectric cap located atop the patterned and cured second photo-patternable low k material and atop an upper surface of the at least one conductively filled region.

18. The interconnect structure of claim 11 wherein an upper surface of the patterned and cured second photo-patternable low k material is coplanar with an upper surface of the at least one conductively filled region.

19. A method of fabricating an interconnect structure comprising:
providing at least one photo-patternable low k material directly on an upper surface of an oxygen-doped SiC antireflective coating which is present atop a substrate, said oxygen-doped SiC antireflective coating has an index of refraction n from 1.0 to 4.5 and an extinction coefficient k from 0.01 to 3.0 at a wavelength of 193 nm, and wherein said oxygen-doped SiC antireflective coating provides a control of reflectivity from the substrate of less than 8% and has an etch rate ratio versus the first photo-patternable low k material that is greater than 1;
forming at least one interconnect pattern within said at least one photo-patternable low k material, said at least one interconnect pattern is formed without utilizing a separate photoresist material;
curing said at least one patterned photo-patternable low k material into a patterned and cured photo-patternable low k material;
removing exposed portions of the oxygen-doped SiC antireflective coating by etching to form an opening within said oxygen-doped SiC antireflective coating; and
filling said at least one interconnect pattern and said opening within said oxygen-doped SiC antireflective coating with an electrically conductive material.

20. The method of claim 19 wherein said oxygen-doped SiC antireflective coating further comprises Ge, B, Sn, Fe, Ta, Ti, Ni, Hf, La, N, S, F or mixtures thereof.

21. The method of claim 19 wherein said providing the oxygen-doped SiC antireflective coating includes a deposition process in which at least an oxygen dopant source is employed.

22. The method of claim 21 wherein said oxygen dopant source is chosen from an oxygen containing compound selected from $O_2$, CO, $CO_2$, $N_2O$, ozone, $SiO_2$ and combinations thereof.

23. The method of claim 21 further comprising a C source and a Si source, or a combined C and Si source.

24. A method of fabricating a dual damascene interconnect structure comprising:
providing first photo-patternable low k material directly on a surface of an oxygen-doped SiC antireflective coating which is located atop a substrate, said oxygen-doped SiC antireflective coating has an index of refraction n from 1.0 to 4.5 and an extinction coefficient k from 0.01 to 3.0 at a wavelength of 193 nm, and wherein said oxygen-doped SiC antireflective coating provides a control of reflectivity from the substrate of less than 8% and has an etch rate ratio versus the first photo-patternable low k material that is greater than 1;
forming at least one first interconnect pattern within the first photo-patternable low k material without a separate photoresist;

providing a second photo-patternable low k material on top of the patterned first photo-patterned low k material and within said at least one first interconnect pattern;

forming at least one second interconnect pattern within said second photo-patternable low k material without a separate photoresist;

curing at least said second photo-patterned patternable low k material;

opening exposed portions of the oxygen-doped SiC antireflective coating; and filling said first and second interconnect patterns and said opening within the oxygen-doped SiC antireflective coating with an electrically conductive material.

25. The method of claim 24 wherein said providing the oxygen-doped SiC antireflective coating includes a deposition process in which at least an oxygen dopant source is employed.

26. The method of claim 25 wherein said oxygen dopant source is selected from an oxygen containing compound selected from $O_2$, CO, $CO_2$, $N_2O$, $SiO_2$ and combinations thereof.

27. The method of claim 25 further comprising a C source and a Si source, or a combined C and Si source.

28. The method of claim 24 wherein said oxygen-doped SiC antireflective coating further comprises Ge, B, Sn, Fe, Ta, Ti, Ni, Hf, La, N, S, F or mixtures thereof.

* * * * *